US005535225A

United States Patent [19]
Mayhew et al.

[11] Patent Number: 5,535,225
[45] Date of Patent: Jul. 9, 1996

[54] TIME DOMAIN ALGEBRAIC ENCODER/DECODER

[75] Inventors: Gregory L. Mayhew; Henry E. Huey, both of Fullerton, Calif.

[73] Assignee: Hughes Aircraft Company, Los Angeles, Calif.

[21] Appl. No.: 135,778

[22] Filed: Oct. 12, 1993

(Under 37 CFR 1.47)

[51] Int. Cl.[6] ............................ H03M 13/00; G06F 7/00; G06F 15/00
[52] U.S. Cl. ........................................ 371/37.1; 364/746.1
[58] Field of Search .................................. 371/37–41, 45, 371/54; 364/746.1

[56] References Cited

U.S. PATENT DOCUMENTS

| | | | |
|---|---|---|---|
| 4,162,480 | 7/1979 | Berlekamp | 371/37.1 |
| 4,251,875 | 2/1981 | Marver et al. | 364/46.1 |
| 4,413,339 | 11/1983 | Riggle et al. | 371/40.1 |

OTHER PUBLICATIONS

Blahut "Transform Decoding Without Transforms", Tenth Annual IEEE Communication Theory Workshop, Apr. 27–30, 1980.

"The Technology of Error Correcting Code," E. R. Berlekamp, *Proceedings of the IEEE,* vol. 68, No. 5, May 1980, p. 588.

"Transform Techniques for Error Control Codes," R. E. Blahut, IBM Journal of Research and Development, vol. 23, No. 3, May 1979, pp. 299–315.

*Primary Examiner*—Roy N. Envall, Jr.
*Assistant Examiner*—Emmanuel L. Moise
*Attorney, Agent, or Firm*—Jeannette M. Walder; Wanda K. Denson-Low

[57] ABSTRACT

Apparatus for encoding and decoding the Alternant code family including three parallel special purpose Galois Field processors, and a timing and control unit. The special purpose processors jointly process a time domain algorithm relatively independently of the timing and control unit, and are adapted so that each step of the time domain algorithm is handled by one or more of the processors.

4 Claims, 6 Drawing Sheets

DECODING PROCESSOR USAGE

TIME DOMAIN DECODER ALGORITHM

FIG.5 ARITHMETIC UNIT 120

ENCODER ALGORITHM

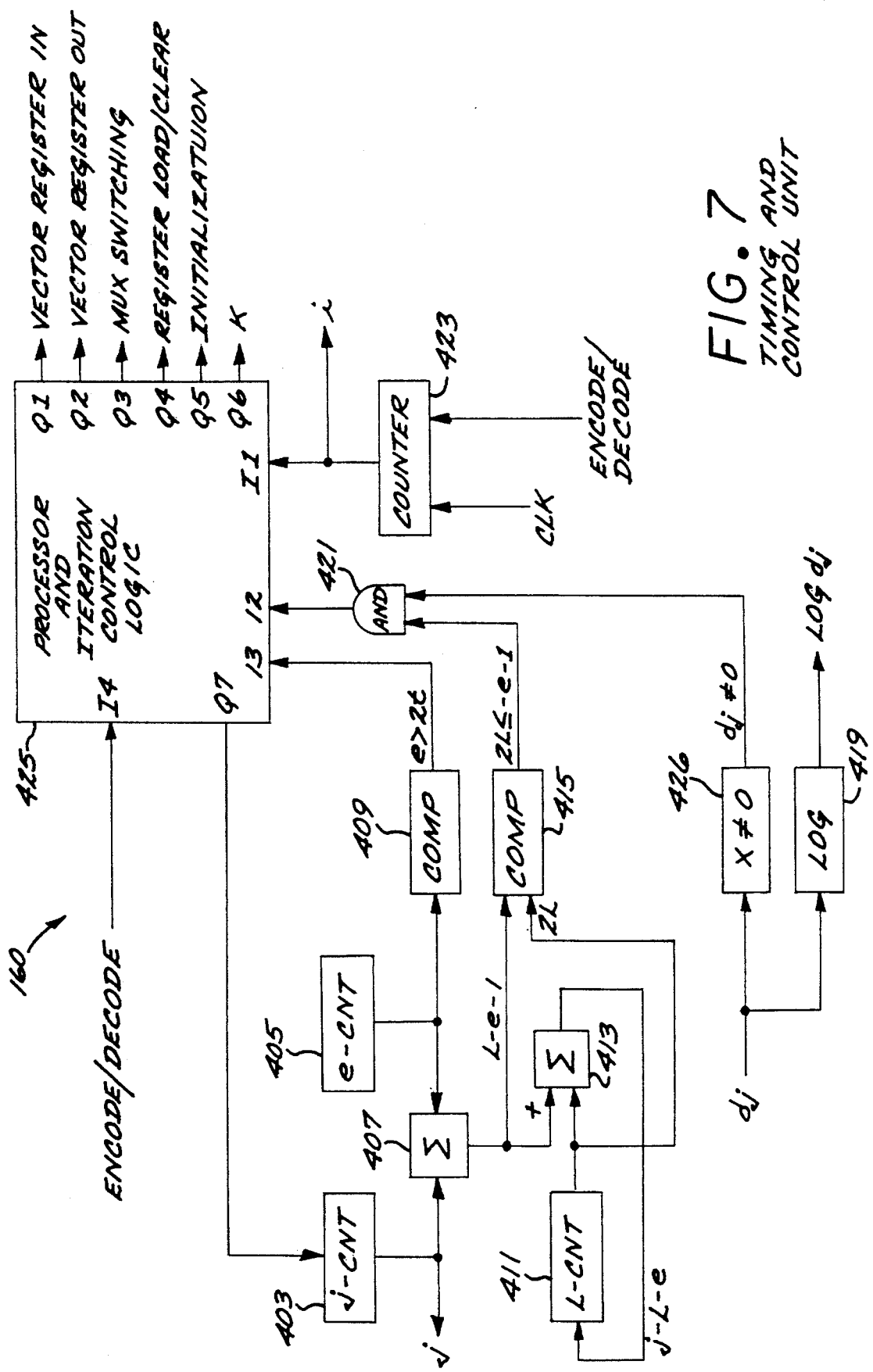

TIME DOMAIN ALGEBRAIC ENCODER/DECODER

BACKGROUND OF THE INVENTION

The disclosed invention generally relates to encoding and decoding the Alternant code family. The Alternant code family includes the Goppa, Strivastava, Bose-Chaudhuri-Hocquenghem (BCH), and Reed-Solomon classes of codes. The disclosed invention is particularly directed to techniques for time domain encoding and decoding the linear, cyclic, error correcting codes of the Alternant family, such as the BCH and Reed-Solomon codes.

The transmission of information over a communications channel generally results in a received signal which includes the original information and distortions. Such distortions may result in loss of information content in the received signal and, therefore, errors in the received signal. Various techniques have been developed over the years for the purpose of increasing the probability of error-free transmission.

A particular approach to increasing the probability of error-free transmission has been directed to coding techniques which provide for the detection of errors and, to varying degrees, the correction of some or all detected errors. Such coding techniques generally involve the inclusion of redundant information based on the data to be transmitted. Generally, encoding would involve performing operations on the data to yield a code word which includes the data information and the redundant information.

Encoding and decoding techniques often apply to only one code within a family rather than to all codes within a family. However, in the Alternant code family, the decoder techniques originally developed just for BCH codes also can decode the other code classes within the Alternant family. Therefore, the remaining discussion focuses on BCH codes while being applicable to all members of the Alternant code family.

A well-known approach to decoding BCH codes is set forth in "The Technology of Error Correcting Codes," E. R. Berlekamp, *Proceedings of the IEEE*, Vol. 68, No. 5, May 1980, p. 588. Disclosed therein is a special purpose microprogrammable Galois Field computer which generally includes an addressing/control unit, a microcode memory unit, and an arithmetic unit.

U.S. Pat. No. 4,162,480, issued to Berlekamp on Jul. 24, 1979, is directed to a special purpose Galois Field computer which includes an address generator, a control unit and an arithmetic unit.

U.S. Pat. No. 4,251,875, issued to Marver et al. on Feb. 17, 1981, is directed to implementation of Galois multiplication using binary logic devices.

U.S. Pat. No. 4,413,339, issued to Riggle et al. on Nov. 1, 1983, is directed to a system for detecting and correcting multiple errors and utilizes a Reed-Solomon code.

Prior art BCH decoders have utilized frequency domain decoding, time domain decoding, or a mixture of both. The frequency domain algorithm is described in the article "Transform Techniques for Error Control Codes," R. E. Blahut, IBM Journal of Research and Development, Vol. 23, No. 3, May 1979, pp. 229–315. The time domain algorithm is set forth in the article, "Transform Decoding Without Transforms," R. E. Blahut, Tenth Annual IEEE Communication Theory Workshop, Apr. 27–30, 1980.

The prior art BCH decoders are complex and inefficient, requiring extensive and time consuming computations. For example, a first step would include a linear transformation of the received data into syndromes or frequency domain data. The second step would be the computation of the erasure locator polynomial, where an erasure is defined as an error of known location and unknown magnitude. The third step would be the computation of the errata (errors and erasures) locator polynomial using the syndromes and erasure polynomial computed previously. The roots of the errata polynomial locate the errors and are used to solve a set of linear equations for the error values.

While the foregoing conventional decoding algorithm attempts to exploit the algebraic properties of BCH codes, the particular steps require equation solving and extensive programming in order to achieve some form of efficient decoding architecture. Typically, prior art decoders have used programmable processor architectures with limited parallel processing capability and, therefore, limited efficiency.

The prior art decoders also cannot generally accommodate within a single architecture three of the major theoretical options available to algebraic codes. Prior art decoders generally cannot accommodate a variable codeword length and variable information rate within the same implementation. Also, prior art decoders generally cannot accommodate a variety of codes such as all the codes within the Alternant family. Furthermore, prior art decoders generally cannot accommodate codes over a variety of Galois field arithmetic structures.

SUMMARY OF THE INVENTION

It is therefore an object of the invention to provide an efficient BCH encoder and decoder which achieves substantial reductions in decoding time and overall complexity.

Another object of the invention is to provide an improved BCH decoder which utilizes three parallel processors for the three major steps in the time domain decoding algorithm.

Still another object of the invention is to provide an improved BCH decoder which includes parallel processors that operate at maximum rate with minimal control intervention.

A further object of the invention is to provide an improved BCH decoder which implements a time domain decoding algorithm directly on the received data.

Still a further object of the invention is to provide a BCH encoder and decoder which is capable of operation with various values of codeword length n and number of information symbols k within the same architecture structure.

Still another object of the invention is to provide a single encoder and decoder architecture which can accommodate codes over a variety of Galois field arithmetic structures.

Another object of the invention is to provide a single encoder and decoder architecture which can accommodate BCH as well as other codes within the Alternant family of codes while achieving a high rate of data throughput.

The foregoing and other objects of the invention are achieved in a time domain BCH decoder which includes an arithmetic unit having three parallel special purpose Galois Field processors and a timing and control unit.

The special purpose processors jointly process a time domain algorithm relatively independent of the timing and control unit, and are adapted so that each major step of the time domain algorithm is handled by one or more of the processors.

BRIEF DESCRIPTION OF THE DRAWINGS

The advantages and features of the disclosed invention will readily be appreciated by persons skilled in the art from the following detailed description when read in conjunction with the drawing wherein:

FIG. 7 is a block diagram of the timing/control unit of the encoder/decoder of FIG. 1.

DETAILED DESCRIPTION

Figure 1:
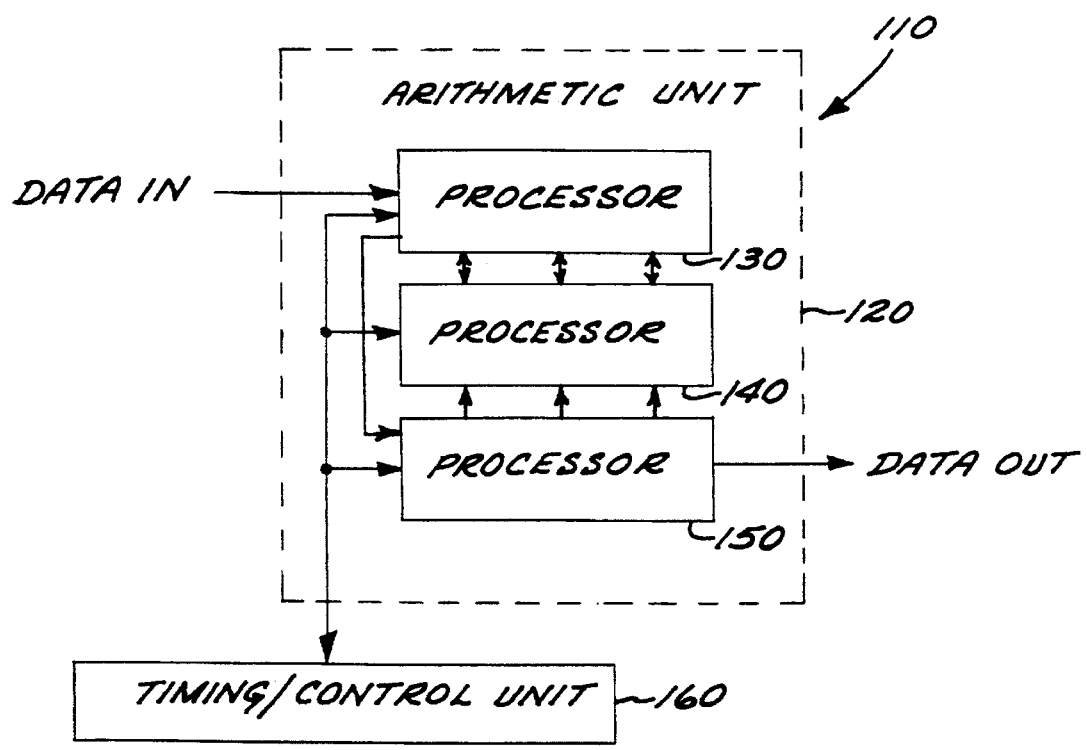
FIG. 1 is a block diagram of the BCH encoder/decoder of the invention.

In the following detailed description and in the several figures of the drawing, like elements are identified with like reference numerals.

The following is directed to the Reed-Solomon code which is a more complex representative of the BCH family of codes. Therefore, the characteristics of the Reed-Solomon code are briefly discussed.

Reed-Solomon codes are a subclass of the BCH family of codes, and are encoded and decoded using the same relations and algorithms as the BCH codes. Therefore, the characteristics of the Reed-Solomon codes are discussed below.

As is well known, the Reed-Solomon code is a non-binary code (i.e., not limited to binary symbols), whose algebraic structure is based on finite Galois fields that are comprised of q elements and are designated GF(q). The value of q is generally represented as a power of a prime number p, namely, $q=p^m$, where m is the number of digits in the vector representation of the Galois Field elements. For purposes of the remaining descriptions the value of p is taken as 2 which are the binary Galois Finite Fields $GF(2^m)$. Each element of the field is a non-binary symbol which is represented by a binary bit vector having m bits. Thus, the Galois Field symbols are a binary m-bit representation of all the $2^m$ possible integers from 0 to $2^m-1$. These binary m-bit vectors are the non-binary symbols that represent the symbols of the Reed-Solomon code.

As is also well known, the use of Galois Fields allows for different symbolic representations that allow algebraic manipulation of representative symbols. The different representations of each symbol in a particular Galois Field are based on the use of primitive irreducible polynomials used to construct that particular Galois Field. For example, the primitive polynomial $X^4+X^1+1=0$ generates $GF(2^4)$ as shown below in Table I, where "a" is the primitive root. The polynomial representations are shown along with the vector representation where it can be seen that the powers of "a" indicate which bits are set in the vector representation. The left column in Table I shows the exponent or power form representation of the non-zero elements of the field where each elements is a power of "a." It is the exponent representation that is primarily used in the following description.

TABLE I

| Power Representation | Polynomial Representation | Vector Representation |
|---|---|---|
| 0 | 0 | (0000) |
| $a^0$ | 1 | (0001) |
| $a^1$ | $a^1$ | (0010) |
| $a^2$ | $a^2$ | (0100) |
| $a^3$ | $a^3$ | (1000) |
| $a^4$ | $a^1 + 1$ | (0011) |
| $a^5$ | $a^2 + a^1$ | (0110) |
| $a^6$ | $a^3 + a^2$ | (1100) |
| $a^7$ | $a^3 + a^1 + 1$ | (1011) |
| $a^8$ | $a^2 + 1$ | (0101) |
| $a^9$ | $a^3 + a^1$ | (1010) |
| $a^{10}$ | $a^2 + a^1 + 1$ | (0111) |
| $a^{11}$ | $a^3 + a^2 + a^1$ | (1110) |
| $a^{12}$ | $a^3 + a^2 + a^1 + 1$ | (1111) |
| $a^{13}$ | $a^3 + a^2 + 1$ | (1101) |
| $a^{14}$ | $a^3 + 1$ | (1001) |
| $a^{15}$ | 1 | (0001) |

The different representations provide for straight-forward implementations of Galois Field arithmetic. Addition and subtraction are identical operations which are a bit-by-bit, exclusive-OR operation on the bit vector. Multiplication is performed by adding the exponents of the multiplicands and reducing modulo q−1. Division is similarly performed by subtracting the divisor exponent from the dividend exponent. Thus, Galois Field adders are generally implemented with m-bit exclusive-OR gates which accept as inputs corresponding bits of the vectors to be added. The outputs of the exclusive-OR gates are the bits of the resulting vector. Galois field multiplication may be performed using look-up tables. The inputs are addresses to the table and can be represented in vector or power form. The multiplier look-up table output is usually in vector form.

Each of the components or symbols of a Reed-Solomon codeword is represented by a symbol in a selected Galois Finite Field which is defined by a field generating primitive polynomial. This field generating polynomial is distinct from the code generator polynomial G(X) that is utilized to generate a particular Reed-Solomon code.

As is well known, the Reed-Solomon code is an (n,k) systematic block code having blocks of length n which respectively include k message symbols and n–k parity symbols appended to the k message symbols. The order of the message symbols comprises a sequence. The parity symbols are selected by application of a predetermined algebraic rule to the message symbols. A receiver applies the inverse of the predetermined algebraic rule to the received data to check the integrity of the message symbols. The order of the parity symbols also comprises a sequence, and the combination of the message symbols and the parity symbols, as encoded for transmission, comprises a codeword.

As is further well known, message sequences, parity sequences, and codewords are conveniently represented as vectors (having nonbinary symbols) or as polynomials (having nonbinary coefficients). Polynomials are further utilized to represent characteristics of the Reed-Solomon code which is both linear and cyclic. Since it is a linear code, every codeword is the sum of k basis vectors. A new code results pursuant to specification of a different set of basis vectors. The Reed-Solomon code is cyclic in that for a particular code, the basis vectors are cyclic shifts of each other. Thus, one generator polynomial, represented as G (X), determines the k basis vectors, and all possible combinations of such k basis vectors determines the code.

As a result, the encoding process is relatively straightforward in that only the generator polynomial needs to be stored in a shift register configuration having appropriate feedback paths. The shift register operation inherently produces all the needed cyclic shifts of the k basis vectors. It is well known that the parity check polynomial $H(X)=(X^n-1)/G(X)$ can also generate the code using a similar shift register configuration.

While the cyclic nature of the Reed-Solomon code is helpful in the decoding process, it is more complicated than the encoding process since the possibility of errors must be taken into account. The disclosed invention provides substantial improvements in the decoding process over the prior art.

The disclosed decoding apparatus processes received data for which erasures and their locations have been already determined by prior receiver processing pursuant to known techniques.

Referring now to the block diagram of FIG. 1, shown therein is an encoder/decoder 110 which includes a Galois Field arithmetic unit (AU) 120 and a timing/control unit (TCU) 160 for controlling the operation of the Galois Field arithmetic unit 120. The Galois Field arithmetic unit 120 includes three Galois processors 130, 140, 150.

Figure 2:
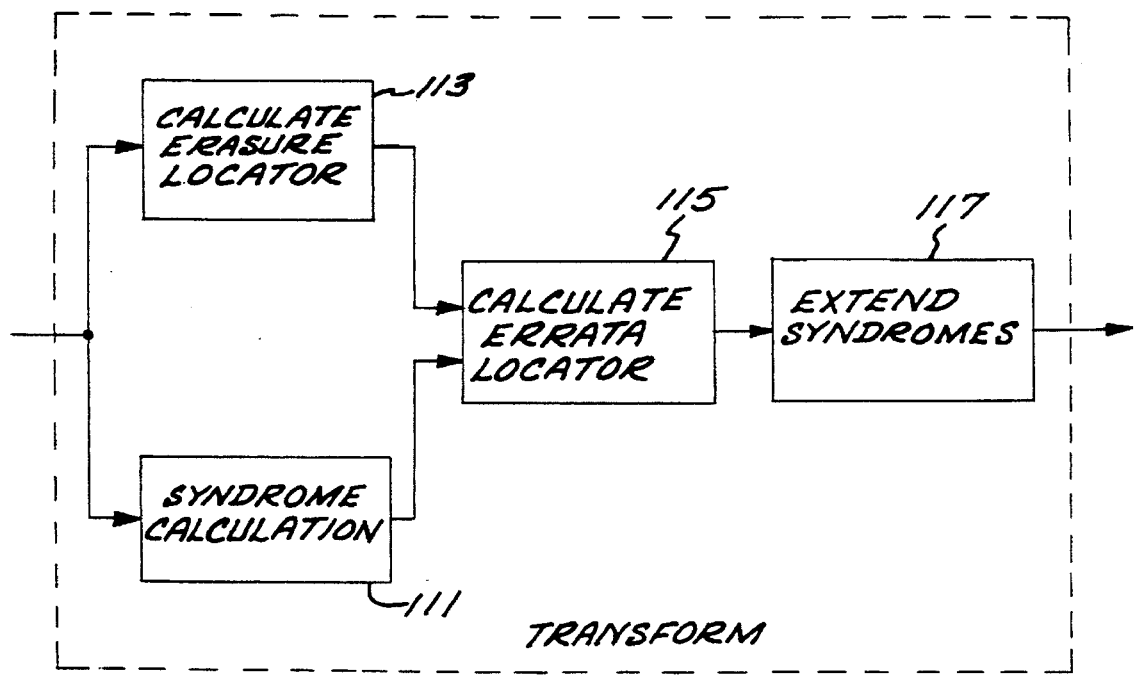
FIG. 2 is a flow chart of the broad decoding operations provided by the encoder/decoder of FIG. 1.

Referring now to FIG. 2, the overall decoding operation includes the calculation of the time domain syndrome vector as identified in the function block 111, and the calculation of the time domain erasure polynomial as identified in the function block 113. A function block 115 identifies the calculation of the time domain errata (errors and erasures) vector via a time domain version of the well-known Berlekamp-Massey algorithm. The frequency domain version of the Berlekamp-Massey algorithm is set forth in "Nonlinear BCH Decoding," E. R. Berlekamp, IEEE Trans. Info. Theory, IT14, p. 242, 1968; and "Shift Register Synthesis and BCH Decoding," J. L. Massey, IEEE Trans. Info. Theory, IT15, No. 1, pp. 122–127, January, 1969. A further function block 117 identifies the extension of the syndrome vector in time and the reconstruction of the received data vector.

In the following discussion of the specific decoding aspects of the encoder/decoder 110, the following symbols are utilized as defined:

S represents the time domain syndrome vector with components $s_i$ for i=0 to i=n−1;

R represents the received data vector with components $r_i$ for i=0 to i=n−1;

V represents a vector with components $v_i$ for i=0 to i=n−1, and is used to calculate and store the erasure vector and the time domain errata (errors and erasures) locator vector;

B represents a temporary storage vector with components $b_i$ for i=0 to i=n−1 and is used as an update vector;

C represents the original message codeword vector with components $c_i$ for i=0 to i=n−1.

j represents the major iteration count and ranges from j=0 to j=n;

e represents the number of erasures declared prior to decoding;

L represents the number of errors that actually occurred;

t represents the number of errors the code can correct given e erasures occurred;

D represents the minimum distance between codewords and determines the number of t errors and e erasures that can be corrected, provided that D is greater than or equal to (2t+e+1);

$d_j$ represents a time domain discrepancy constant;

m identifies the width in bits of the data processing components in the processors 130, 140 and 150;

$z_j$ identifies the location one of the erasures in the received data vector that have been determined by prior receiver processing.

Different portions of the decoding algorithm implemented with the encoder/decoder 110 require different numbers of iterations to complete. The decoding tasks are partitioned as evenly as possible among the three Galois Field processors 130, 140, 150 and the association of tasks to the processors 130, 140, 150 is set forth in FIG. 3. The task/processor association of FIG. 3 strictly corresponds to the decoder algorithm and thus provides for maximum processor efficiency. The task assignments are divided into three major processing periods.

Period 1

As soon as the received data is loaded into the encoder/decoder 110, the processor 130 computes the time domain syndrome components (or symbols), while the processors 140 and 150 construct the time domain erasure vector components. These steps are carried out for j=e iterations, where e is the number of erasures declared during prior receiver processing.

Period 2

The processor 130 continues computing the time domain syndrome components. Each new component is used in the Berlekamp Massey algorithm to update the estimate of the time domain errata (errors and erasures) vector. The processors 140, 150 carry out the calculations involved in the time domain Berlekamp Massey algorithm. These processes continue for j=(e+1) to j=2t, where t is the number of errors that can be corrected, given that e erasures occurred.

Period 3

If the received data vector R has not been stored in an external buffer, then the processor 150 reconstructs the received data vector from the syndrome vector S of the iteration j=(2t+1). The processors 130, 140 extend the time domain syndrome vector, which is carried out for iterations j=(2t+1) to j=n. At the iteration j=n, the processor 130 contains the error vector and provides correction by subtracting the error vector from the received data. The resulting vector is the corrected data.

Figure 4:
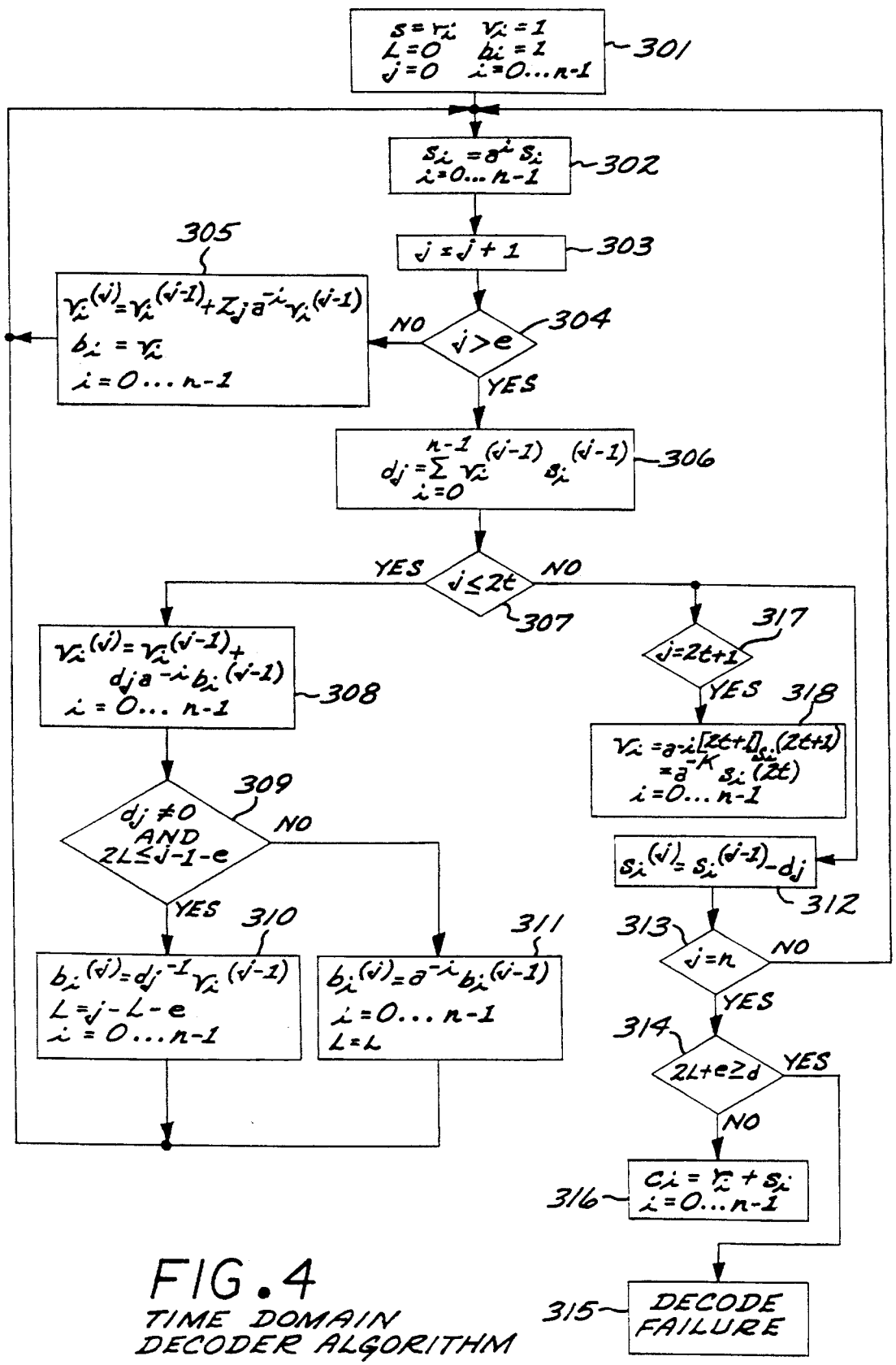
FIG. 4 is a flow chart of the operations of the time domain decoding algorithm implemented by the encoder/decoder of FIG. 1.

Referring now to the flowchart of FIG. 4, illustrated therein is the algorithm implemented by the encoder/decoder 110 of FIG. 1. Pursuant to the function block 301, the components of the time domain syndrome vector S are initialized to be equal to the components of the received vector R, the components of the vector V are initialized to be all 1's (i.e., each component is set to the root $a^0=1$), the components of the temporary storage vector B are initialized to be all 1's (i.e., each component is set to the root $a^0=1$), the number of errors L is set to 0, and the iteration count j is set to 0.

Pursuant to the function block 302., the components of the syndromes for the $j^{th}$ iteration are computed for each of the n components $s_i$ of the syndrome vector S. Specifically, the $i^{th}$ component of the syndrome vector S is scaled (multiplied) by the corresponding root $a^i$ of the Galois Field $GF(2^m)$. The iteration count j is incremented pursuant to the function block 303, and a decision block 304 determines the flow of the processing as a function of the value of j. If the iteration count j is not greater than the number of declared erasures e, then the processing continues with the function block 305.

Pursuant to the function block 305, the $j^{th}$ iteration of the calculation of the erasure vector takes place. Specifically, each of the n elements of the vector V is calculated for the $j^{th}$ iteration as follows:

$$v_i^{(j)}=v_i^{(j-1)}+z_i a^{-i}v_i^{(j-1)} \quad \text{(Equation 1)}$$

where the parenthetical superscripts are iteration indicators and superscripts without parentheses are exponents. The resulting vector V is copied into the update vector B.

After the processing of the function block 305 is completed, processing continues pursuant to the previously described function block 302. Thus, for the iterations j=0 through j=e, the erasure vector components are calculated and the first iterations for calculating the syndrome vector components are performed. The resulting erasure vector components are stored in the update vector B so that the update vector B is properly initialized for use with the Berlekamp Massey algorithm starting at the iteration j=e+1.

Figure 3:
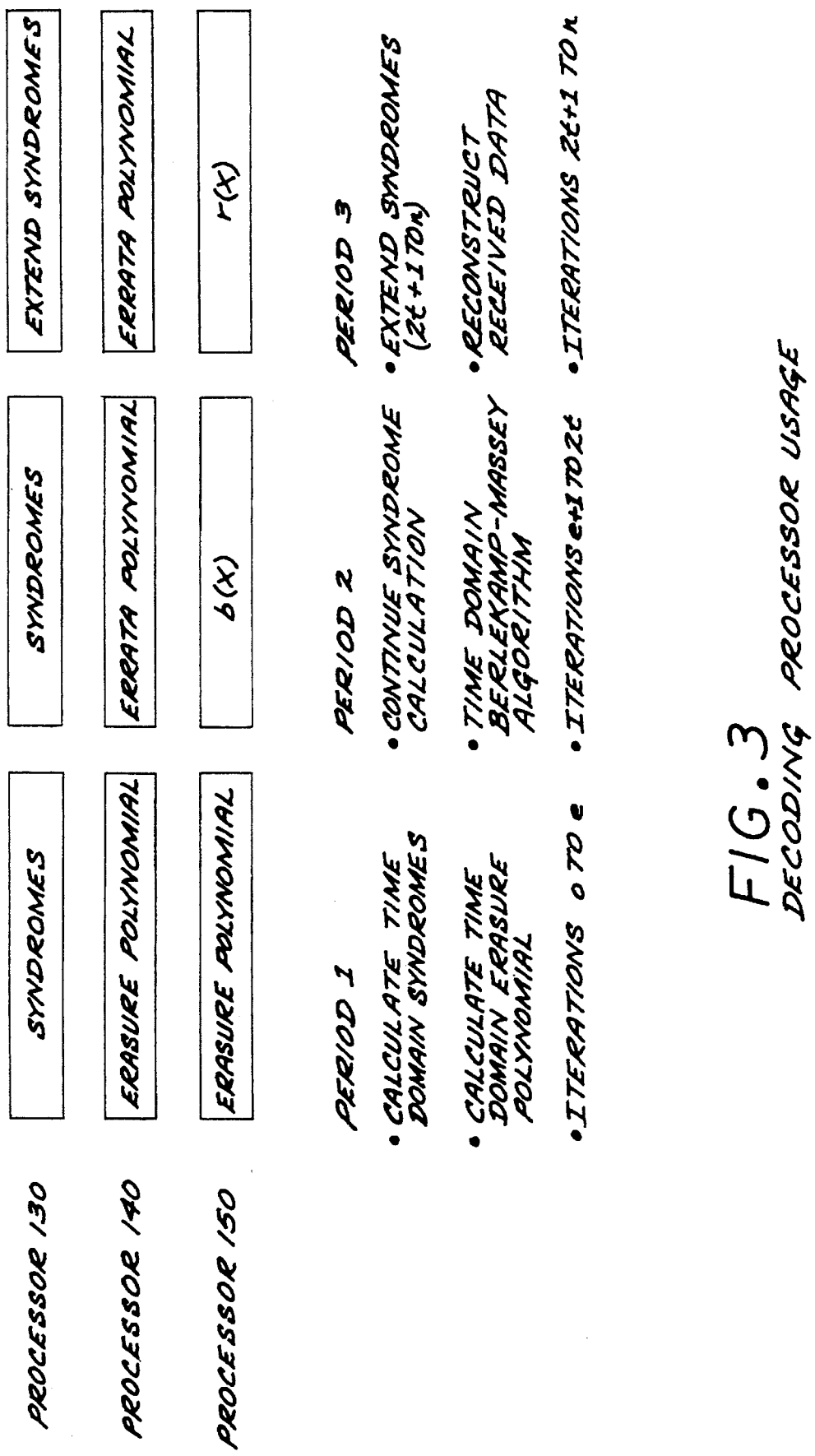
FIG. 3 is a diagram identifying the decoding operations provided by the respective processors of the arithmetic unit of the encoder/decoder of FIG. 1.

The processing for the iterations j=0 through j=e correspond to the Period 1 processing previously described relative to FIG. 3.

Pursuant to the function block 306, the discrepancy value $d_j$ of the iteration j is calculated on the basis of the previously calculated erasure vector components and syndrome vector components:

$$d_j = \sum_{i=0}^{n-1} v_i^{(j-1)} s_i^{(j-1)} \quad \text{(Equation 2)}$$

The flow of processing is then controlled by a decision block 307 as a function of the value of the iteration count j. If the value of the iteration count j is less than or equal to 2t, processing continues with the function block 308.

Pursuant to the function block 308, the n components of the errata locator vector are estimated in accordance with the Berlekamp Massey algorithm and the coefficients are stored in the vector V:

$$v_i^{(j)}=v_i^{(j-1)}+d_j a^{31\ i} b_i^{(j-1)} \quad \text{(Equation 3)}$$

A decision block 309 then determines the processing flow as a function of the discrepancy value $d_j$ and the cumulative number of discovered errors L for that iteration j. If the discrepancy value $d_j$ is non-zero and the value of 2L is less than or equal to j−1−e, processing continues with the function block 310. Otherwise, processing continues with the function block 311.

Pursuant to the function block 310, the temporary storage vector B and the error count L are updated as follows:

$$b_i^{(j)}=d_j^{-1}v_i^{(j-1)} \quad \text{(Equation 4)}$$

$$L=j-L-e \quad \text{(Equation 5)}$$

Pursuant to the function block 311, the temporary storage vector B and the error count L are updated as follows:

$$b_i^{(j)}=a^{-i}b_i^{(j-1)} \quad \text{(Equation 6)}$$

$$L=L \quad \text{(Equation 7)}$$

After processing pursuant to either of the function blocks 310, 311, processing returns to the function block 302. Thus, for the iterations j=(e+1) to j=(2t), the calculation of the syndrome vector components continues, and the errata locator vector components are calculated pursuant to the Berlekamp Massey algorithm.

When the iteration count j is greater than 2t, processing takes place pursuant to the function blocks 312, 313, 314, 315, 316, 317, 318, 319. Pursuant to the function block 312, the extended syndromes are calculated as follows:

$$s_i^{(j)}=s_i^{(j-1)}-d_j \quad \text{(Equation 8)}$$

A decision block 313 controls the processing to return to the function block 302 so long as the iteration count j is not equal to n.

When the iteration count j is equal to n, processing branches to the decision block 314 which provides a determination of whether the quantity (2L+e) is greater than or equal to the minimum distance D. If so, then decoding has failed, as identified by the function block 315. If the condition of the function block 314 is not satisfied, decoding has not failed and processing continues with the function block 316. The fully transformed errata vector is in the vector S, and the n components of the corrected codeword are obtained pursuant to the function block 316:

$$c_i=r_i+s_i \quad \text{(Equation 9)}$$

If the received codeword R was saved in an external storage register, it may be utilized for the function block 316. Otherwise, the received vector R may be reconstructed on the iteration j=2t+1 pursuant to the decision block 317 and the function block 318. The decision block 317 determines whether the iteration count j is equal to 2t+1, and if so it allows processing pursuant to the function block 318. The function block 318 reconstructs the received vector and stores it in the vector V as follows:

$$v_i=a^{-i[2t+1]}s_i^{(2t+1)} \quad \text{(Equation 10)}$$

$$v_i=a^{-K}s_i^{(2t+1)}$$

where $$K=i[2t+1] \quad \text{(Equation 11)}$$

Figure 5:
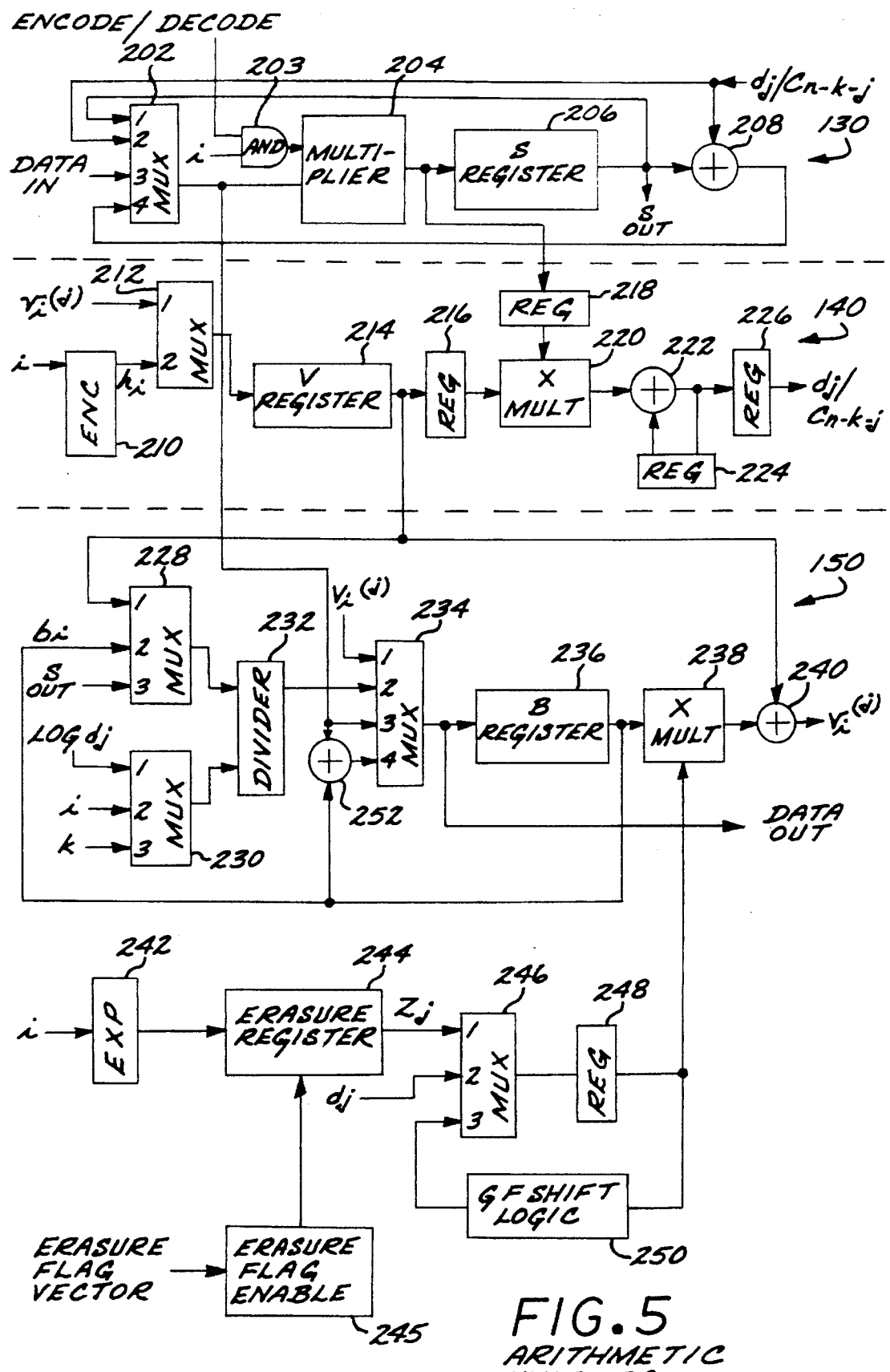
FIG. 5 is a block diagram of the processors of the arithmetic unit of the encoder/decoder of FIG. 1.

Referring now to FIG. 5, schematically shown therein is a block diagram of the processors 130, 140, 150 of the arithmetic unit 120 of the encoder/decoder of FIG. 1.

The processor 130 includes a four-input multiplexer 202 which provides its output as an input to a Galois Field multiplier 204. The other input to the Galois Field multiplier 204 is provided by an AND circuit 203 which is responsive to the count i and an ENCODE/DECODE signal. The ENCODE/DECODE signal is high for decoding, pursuant to which the AND circuit 203 couples the count i to the multiplier 204. The ENCODE/DECODE signal is low for encoding, pursuant to which the input to the AND circuit is a low or zero signal. The count i inputs represent the elements of the field $GF(2^m)$. The processor 130 further includes an n by m S-register 206 which has n components, each being m bits wide. The S-register 206 stores the values of the vector S previously described relative to the flowchart of FIG. 4.

The output of the S-register 206 is provided to the position 1 input of the multiplexer 202 as well as to a Galois Field adder 208. The other input to the Galois Field adder 208 is the discrepancy value $d_j$ (for decoding) or the parity symbol $C_{n-k-j}$ (for encoding) which are provided by the processor 140 described further below. The discrepancy value $d_j$ or the parity symbol $C_{n-k-j}$ is further provided to the position 2 input of the multiplexer 202. The received data vector R provides the input for the position 3 input of the multiplexer 202, while the output of the Galois adder 208 is coupled to the position 4 input of the multiplexer 202.

The processor 140 includes an encode circuit 210 which is utilized for the encoding process that is described further herein. Briefly, the encode circuit 210 outputs the parity vector components $h_i$ in response to the count i. The output of the encode circuit 210 is coupled to the position 2 input of a two-input multiplexer 212. The input to the position 1 of the multiplexer 212 is provided by the components of the vector V which are provided by the processor 150.

The output of the two-input multiplexer 212 is coupled to an n by m V-register 214. The output of the V-register 214 is coupled to a one by m reclocking register 216 which has its output coupled as an input to a Galois Field multiplier 220. The other input to the Galois Field multiplier 220 is provided by the output of a one by m reclocking register 218. The register 218 receives its input from the Galois Field multiplier 204 of the processor 130. The output of the multiplier 220 is provided as an input to Galois Field adder 222 which receives another input from a one by m register 224. The output of the adder 222 provides the input to the register 224, and further provides the input to a one by m register 226. The output of the register 226 is the discrepancy value $d_j$ for the decoding process, while its output is the parity symbol $C_{n-k-j}$ for the encoding process.

The third Galois Field processor 150 includes a three-input multiplexer 228 which has its position 1 input coupled to the output of the V-register 214. The multiplexer 228 and a three-input multiplexer 230 provide inputs to a Galois Field divider 232. The output of the divider 232 is provided to the position 2 input of a four-input multiplexer 234. The position 3 input of the multiplexer 234 is provided by the output of the multiplexer 202 of the processor 130. The output of the multiplexer 234 is provided to an n by m B-register 236. The output of the B-register 236 is provided as an input to a Galois Field multiplier 238 which in turn provides its output to a Galois Field adder 240. The other input to the Galois Field adder 240 is provided by the output of the V-register 214 of the processor 140. The output of the adder 240 includes the components of the vector V.

The processor 150 further includes an exponentiation circuit 242 which is responsive to the count i provided by the timing/control unit 160. The exponentiation circuit 242 provides as its output the vector representation of the root $a^i$, where i is the input. The output vector provided by the exponentiation circuit 242 is selectively stored in an e by m erasure register 244 pursuant to control by an erasure flag enable circuit 245 which is responsive to the one by n erasure flag vector that identifies the locations of the erasures. The output of the erasure register 244 is $Z_j$ which identifies the locations of the erasures and is coupled to the position 1 input of a three-input multiplexer 246. The discrepancy value $d_j$ provided by the processor 140 is coupled to the position 2 input of the multiplexer 246. The output of the multiplexer 246 is coupled to a one by m register 248 which has its output coupled as an input to the Galois Field multiplier 238. The output of the register 248 is further coupled to a Galois Field shift logic circuit 250 which provides its output to the position 3 input of the multiplexer 246. The Galois Field shift logic circuit 250 can be implemented with a shift register structure having appropriate feedback connections defined by the same primitive polynomial used to define the Galois Field GF ($2^m$).

Referring again to the B-register 236, its output is provided to the position 2 input of the multiplexer 228, as well as to a Galois Field adder 252. The other input to the Galois Field adder 252 is provided by the output of the multiplexer 202 of the processor 130. The output of the Galois Field adder 252 is coupled to the position 4 input of the multiplexer 234.

The decoding processing provided by the processors 130, 140, 150 will now be discussed in conjunction with the flowchart of FIG. 4. Pursuant to the function block 301, the n components of the V-register 214 and the B-register 236 are initialized with the root $a^0=1$ of the Galois Field GF($2^m$) used to define the symbols of the code. The components of the received data vector R are provided to the position 3 input of the multiplexer 202 for the calculation of the initial j=0 iteration time domain syndrome vector $S^{(0)}$. The count value i is sent to the exponentiation circuit 242 which converts the count values to the Galois Field elements $a^i$ and provides such elements to the erasure register 244. Pursuant to control by the erasure flag enable circuit 245, the erasure register 244 stores only such elements from the exponentiation circuit 242 that correspond to locations of erasures as defined by the erasure flag vector that was provided by receiver processing prior to decoding. The values of $Z_j$ for j=1 to j=e are GF($2^m$) symbols that identify the locations of the erasures and are used in the erasure vector processing of the function block 305. The exponentiation circuit 242 and the erasure flag enable circuit 245 are enabled only for initialization at j=0.

The iterative syndrome vector $S^{(j)}$ is calculated for each iteration j as defined in the function block 302. For the initial j=0 iteration, the multiplier 204 accepts the components of the received data vector R as provided to the position 3 input of the multiplexer 202. For all subsequent iterations of j, the previous components of the vector $S^{(j-1)}$ are shifted out of the S-register 206 into the position 1 input of the multiplexer 202. The multiplier 204 takes the previous n components of the vector S from the output of the multiplexer 202 and scales them by the appropriate power of $a^i$. The resultant vector $S^{(j)}$ is used to replace the old vector $S^{(j-1)}$ by shifting $S^{(j)}$ until the least significant component $s_0$ appears in the least significant right-most location of the S-register 206. This process of multiplying and overriding the old results with the new results repeats at the start of each iteration of j.

It should be noted that the Galois Field symbols used with one of the inputs to the multiplier 204 are represented by the count i. It should be readily understood that a look-up table implementation of a Galois Field multiplier 204 can be implemented to utilize both the power and vector representations associated with a particular Galois Field symbol.

Prior receiver processing has declared e erasures so the value of e is a known quantity as utilized by the timing/control unit 160 (FIG. 1) for controlling the flow processing pursuant to the function block 304 (FIG. 5). The erasure vector V requires e iterations to calculate, and the iterative erasure vector results are calculated pursuant to the function block 305 so long as the iteration count j is less than or equal to e. The results of the iterative erasure vector calculations are stored in the V-register 214 as part of the automatic initialization of the Berlekamp Massey algorithm. Each new component of the vector V is computed by addition via the Galois Field adder 240 which adds the old version of the component to a scaled version of the old component. The old component version $v_i^{(j-1)}$ is provided by the V-register 214 and the scaled prior component $Z_j a^{-i} v_i^{(j-1)}$ is provided by the multiplier 238.

Several calculations are necessary before the scaled prior component $Z_j a^{-i} v_i^{(j-1)}$ is available at the output of the multiplier 238. The quantity $Z_j a^{-i}$ is obtained by first selecting $Z_j$ from the position 1 input of the multiplexer 246 and placing it in the register 248. The values for $Z_j$ are taken sequentially from the erasure register 244, one per iteration, for j=1 to j=e. Then $Z_j a^{-i}$ is computed by multiplying $Z_j$ by $a^{-1}$ for i times. Since $a^{-1}$ is a Galois Field element, the multiplication is implemented by the Galois Field shift circuit 250. After each multiplication, the new product overrides the previous product in the register 248 via the position 3 input of the multiplexer 246. This multiplication and overriding continues for i=0 to i=n until all $Z_ja^{-i}$ are respectively calculated and utilized for each value of i. The multiplier 238 forms $Z_ja^{-i}v_i$ by taking $Z_ja^{-i}$ from the register 248 and $b_i$ from the update B-register 236.

During the erasure vector calculations pursuant to the function block 305, the update B-register 236 duplicates the contents of the V-register 214. The equality of the vectors B and V results from coupling the output of the adder 240 to both the B and V registers via their respective multiplexers. The output of the adder 240 is provided to both the position 1 input of multiplexer 212 and to the position 1 input of multiplexer 234. The processing of the syndrome vector S and erasure polynomial vector V continues simultaneously until the iteration count j is equal to e.

For the j greater then e iterations, the processor 130 continues with the computation of the components of the syndrome vector S, and the processors 140, 150 provide error processing via the Berlekamp Massey algorithm. The discrepancy value $d_j$ is computed pursuant to the function block 306 after the $j^{th}$ syndrome calculation pursuant to the function block 302, but prior to the $j^{th}$ iteration in the Berlekamp Massey algorithm. The discrepancy value $d_j$ is a convolution (sum of products) of the $v_i$ and $s_i$ components. The necessary component products are individually formed by the multiplier 220 which receives the $s_i$ component from the S-register 206 and receives the $v_i$ component from the V-register 214. The $v_i$ and $s_i$ inputs are buffered for the multiplier 220 by the registers 216, 218. Each new component product is incorporated into an overall sum via an accumulator circuit that includes the Galois Field adder 222, and the registers 224, 226. Intermediate sums are placed in the register 224 only. At the $n^{th}$ clock of the $j^{th}$ iteration, all necessary products have been added, and the overall sum is loaded into the register 226 as the discrepancy value $d_j$.

For j greater than e iterations but j less than or equal to 2t iterations, the Berlekamp Massey algorithm revises all n components of both the errata locator vector V and the update vector B. The errata vector V is computed pursuant to function block 308 and Equation 3. The update vector B is computed pursuant to function block 310 and Equation 4 or pursuant to function block 311 and Equation 6 as determined by decision block 309. In both the errata and update vectors, the n vector components are subscripted from 0 to n−1. During the calculations these components are circulated in their respective registers. As these vectors are circulated, the $i^{th}$ component in each vector is modified before it is placed back in its respective register. Storage is minimized by storing the new version of the vector component in the location occupied by the old version. However, the new update vector component $b_i^{(j)}$ may use the old version of the errata vector component $v_i^{(j-1)}$. Therefore, the V register 214 and B register 236 processing occur simultaneously rather than having B register 236 processing subsequent to V register 214 processing. The processing on the $i^{th}$ component of both the errata vector V and the update vector B must be complete before any processing on the $(i+1)^{th}$ component of either vector can commence. However, in the discussion below, the errata vector V and the update vector B processing are presented separately.

The Berlekamp Massey algorithm uses the discrepancy value $d_j$ to revise the errata locator vector V in accordance with Equation 3. The Galois Field adder 240 computes the new version of the $i^{th}$ component $v_i^{(j)}$ by adding the old version $v_i^{(j-1)}$ errata component to the $d_ja^{-i}$ scaled version of the corresponding update component $b_i^{(j-1)}$. Several intermediate calculations are again required before each $v_i^{(j)}$ component can be calculated.

When the count i equals 0, the discrepancy value $d_j$ contained in register 226 is provided to input 2 of multiplexer 246, stored in register 248, and stored in the Galois Field shift logic 250. For each subsequent component i, when the count i is incremented, the Galois Field shift logic 250 is clocked once and the result is stored in register 248 via multiplexer 246. In this manner, the register 248 always contains the $d_ja^{-i}$ scale factor needed for computing component $v_i^{(j)}$. Each time the Galois shift logic 250 iS clocked, its contents is multiplied by a $^{-1}$. At the start of loop count i+1, the Galois shift logic contains $d_ja^{-i}$ from the previous iteration i. So clocking the Galois logic once changes the contents to $d_ja^{-(i+1)}$.

For loop count i, the $d_ja^{-i}$ contained in register 248 is presented to multiplier 238. The $b_i^{(j-1)}$ component of the update vector is provided by the B register 236 to the other input of multiplier 238. The scaled vector component $d_ja^{-i}b_i$ from multiplier 238 is combined with the $v_i$ component from V register 214 at Galois Field adder 240 in accordance with Equation 3 to produce the new $v_i^{(j)}$ component. The output of adder 240 is provided to input 1 of multiplexer 212 and the V register 214. This process iterates until all n components of the V vector have been modified.

In the disclosed time domain algebraic decoder implementation of the Berlekamp Massey algorithm, a component of the update vector B is modified as the corresponding component of the errata vector V is modified. The processing required to update the B register is determined pursuant to the decision block 309 in FIG. 4 in conjunction with the timing/control unit 160 in FIG. 1.

If the update is made pursuant to the function block 310, the update component $b_i^{(j)}$ is the errata component $v_i^{(j-1)}$ scaled by the inverse of the discrepancy value $d_j$. The components of the prior vector $V^{(j-1)}$ are provided by the V register 214 and are coupled through the position 1 input of the multiplexer 228 to the divider 232. The vector components $v_i^{(j-1)}$ are divided by $d_j$ in the divider 232 by actually inputting the log of $d_j$ in binary form. Such log of $d_j$ corresponds to the exponent value of its power representation as a Galois Field element. The log of $d_j$ is provided by the timing/control unit 160. The output of the divider 232, which are the components of the update vector B, is provided to the update B register 236 via the position 2 input of the multiplexer 234.

If the update vector B is updated pursuant to the function block 311, then the updated component $b_i^{(j)}$ is the old version $b_i^{(j-1)}$ scaled by $a^{-i}$. The multiplexer 228 is controlled so that the B register 236 output is applied to multiplexer 228 position 2 input and then to the dividend side of the divider 232. The multiplexer 230 is controlled so that the exponent magnitude i of $a^{-i}$ is applied to multiplexer 230 position 2 input and then to the divisor side of the divider 232. The output $a^{-i}b_i^{(j-1)}$ of the divider 232 is then loaded into the update B register 236.

If the received vector R has not been stored in an external hold buffer, then at iteration j equals 2t+1 the received data vector R is reconstructed from the time domain syndrome vector S. The syndrome vector S is transformed into the received vector R by scaling each syndrome vector component $s_i$ by the respective Galois Field element $a^{-K}$, where K is the product of the iteration count 2t+1 and the component location i. The binary quantity K, which is provided by the timing/control unit 160, cancels out the effects of the syndrome transformation for each component of the received data. Particularly, the output of the S register 206 is provided to the divider 232 via position 3 of the multiplexer 228. The binary quantity K is input to the divisor side of the divider 232 via position 3 input of multiplexer 230. The reconstructed received vector components $r_i$ are provided to the B register 236 via multiplexer 234.

For iterations where j is greater than 2t, the syndrome extension steps are performed. The Berlekamp Massey algorithm has computed 2t of the n time domain components that define a codeword. The syndrome components for j equals 2t+1 to j equals n are calculated in the three steps pursuant to function blocks 306, 312, and 302. As a result of the Berlekamp Massey algorithm in prior iterations, the discrepancy value $d_j$ calculation pursuant to function block 306 contains the proper components so that the discrepancy equation can now act as a syndrome sequence generator. The discrepancy value $d_j$ continues to be modified as described above by forming a sum of products as the V register 214 and the S register 206 circulate. During the syndrome extension steps, the errata vector V is not changed as it circulates in the V register 214. Such recirculation is achieved by disabling the multiplier 238 and controlling the Galois adder 240 so that zero is added to the output of the V register. The output of the Galois adder 240 is then provided back to the V register 214 via the position 1 input of the multiplexer 212. In contrast, the S vector is modified as it recirculates during the syndrome extension step. To form the new S vector, the discrepancy value $d_j$ in register 226 is added by Galois adder 208 to the $s_i$ component provided by the S register 206. This sum is scaled by $a^i$ pursuant to function block 302 by inputting the sum from adder 208 into multiplier 204 via multiplexer 202. The other input to the multiplier 204 is the exponent i. The resultant new S vector component $s_i^{(j)}$ is then stored in the S register 206.

At iteration j equals n, the syndrome extension is complete and data correction can take place. If the received vector R is stored in an external buffer, then data correction is accomplished external to the decoder. The error vector stored in the S register 206 is presented externally via input 4 of multiplexer 202 and then via input 3 of multiplexer 234. If the received vector has been reconstructed at iteration j equals 2t+1, then the B register 236 contains the received vector R. The estimate of the correct codeword is formed at position 4 input of multiplexer 234 by combining the R vector in the B register 236 with the errata vector in the V register 214 at Galois adder 252. The codeword estimate is coupled via the output of multiplexer 234 to the output of encoder/decoder 110 in FIG. 1.

Figure 6:
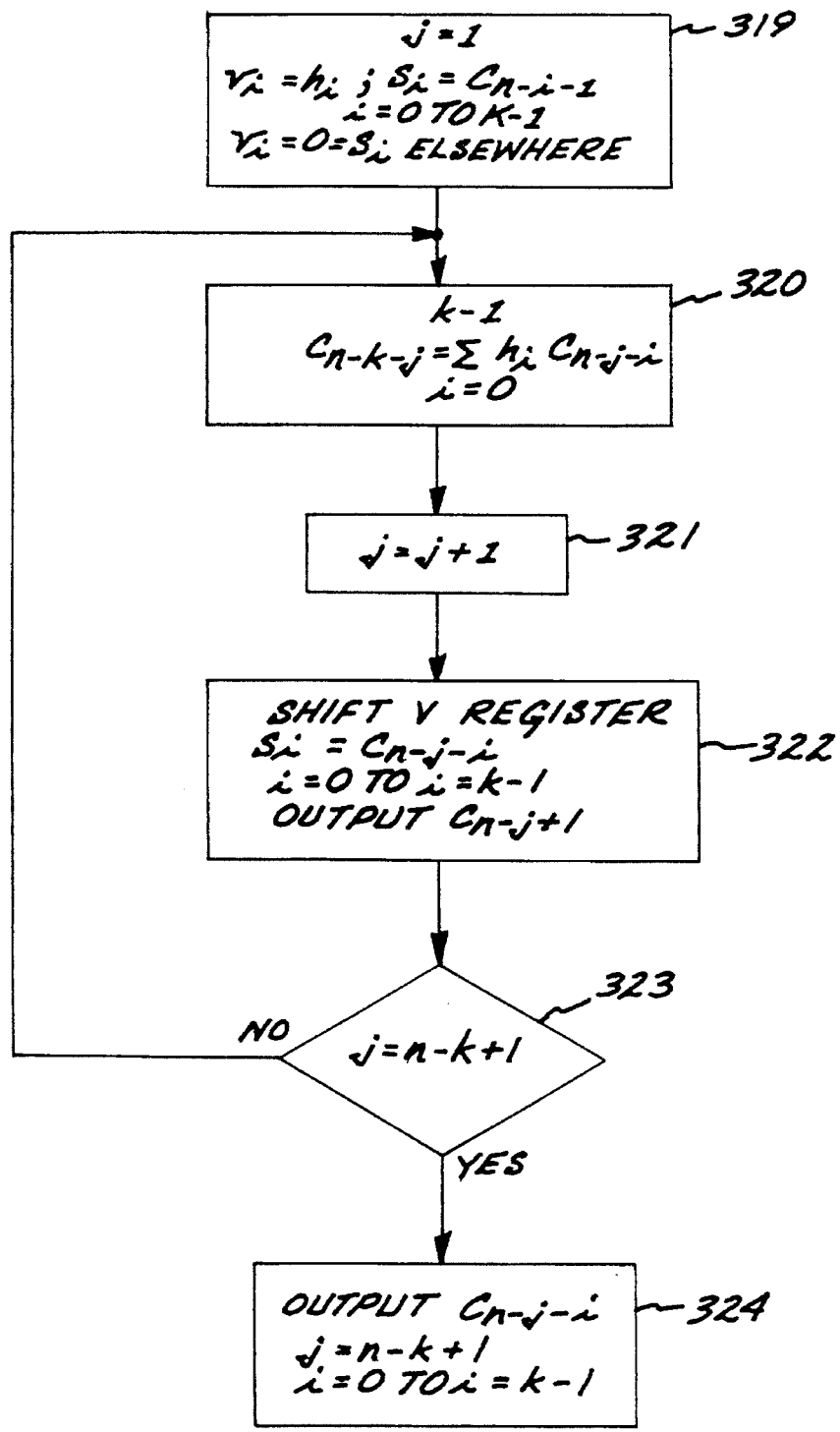
FIG. 6 is a flowchart of the BCH encoder algorithm utilized by the encoder/decoder of FIG. 1 to provide BCH encoding.

Referring now to the flowchart of FIG. 6, shown therein is the processing provided by the encoder/decoder 110 for encoding a codeword vector C. Because the encoder uses the systematic form, the coefficients $C_{n-1}$ to $C_{n-k}$ are the information symbols and $C_{n-k-1}$ to $C_0$ are the parity symbols, with $C_{n-1}$ transmitted first and $C_0$ transmitted last. The encoding process is the computation of codeword components $C_{n-k-1}$ to $C_0$ which are known as parity symbols. During the encoding process, the loop counter i is incremented from 0 to k-1 for each iteration count j. The iteration counter j goes from 0 to n-k+1.

Initialization takes place at iteration count j equals 1 pursuant to function block 319. The encode circuit 210, which is a lookup table, outputs the parity polynominal coefficients $h_i$ for i=0 to i=k-1, and outputs zeroes for i=k to i=n-1. The output of encode circuit 210 passes through input 2 of multiplexer 212 to the V register 214. After n clocks, the k components of the parity polynomial coefficients are stored in the $v_0$ to $v_{k-1}$ positions of the V register 214. The remaining positions of the V register 214 contain zeros. Also during iteration count j equals 1, for i=0 to i=k-1, the information symbols are presented to the encoder on the Data In line at input 3 of multiplexer 202. The Data In line is set to zero by the user after the k information symbols have been presented. The output of multiplexer 202 passes through the multiplier 204 and then goes into the S register 206. The AND circuit 203, which detects a decode condition, forces the other multiplier input to zero during encoding because $a^0=1$ in a Galois Field. After n clocks, the k message symbols are stored in the $s_0$ to $s_{k-1}$ positions of the S register 206. Note that $C_{n-1}$ is in $s_0$ and that $C_{n-k}$ is in $s_{k-1}$. The remaining positions of the S register 206 contain zeros.

For iteration j equals 1 to iteration j equals n-k+1, the non-message codeword symbols are computed by convolution as defined by function block 320 of FIG. 6. Each codeword symbol computation is a k point time domain convolution of the k parity polynomial coefficients stored in the V register 214 with the k most recent codeword symbols stored in the S register 206. To compute a codeword symbol, the encoder performs a sum of products calculation as follows. The S register 206 contents are circulated through adder 208, multiplexer 202, and multiplier 204 back to the S register 206 and also into the reclocking register 218. The V register 214 contents are circulated into the reclocking register 216 and recirculated through adder 240 and multiplexer 212 back to the V register 214. For i=0 to i=k-1 clocks, the corresponding components of the V register 214 and the S register 206 are multiplied at multiplier 220. The total sum of products is formed in the accumulator comprising the Galois adder 222, the temporary result register 224, and the final result register 226. At i=k-1, the final result register-226 holds the computed codeword symbol $C_{n-k-j}$. The S register 206 contents are shifted by one and the new codeword symbol is placed in the leftmost stage of the S register 206. There are now k+1 codeword symbols in the S register 206, but only the newest k codeword symbols will be used in the next codeword symbol computation.

As a result of the function block 320, the parity polynomial coefficients $h_i$ are in the leftmost stages of the V register 214 instead of the rightmost stages. Similarly, the codeword symbols $C_j$ are in the leftmost stages of the S register 206 instead of the rightmost stages. In preparation for computing the next codeword symbol, the iteration counter j is incremented in accordance with function block 321 and the S register 206 and V register 214 contents are realigned by n-k positions in accordance with function block 322. The realignment is necessary because the S register 206 and the V register 214 are n stages in length but the encoding algorithm uses vectors of length k where k is less than n. The parity polynomial coefficients $h_i$ are shifted in the V register 214 from the k leftmost stages to the k rightmost stages. Similarly, the codeword symbols $C_j$ are shifted in the S register 206 from the k+1 leftmost stages to the k rightmost stages and the S OUT line. The oldest codeword symbol $C_{n-j+1}$ appears on the S OUT line at each iteration j and is never used again in subsequent convolution computations.

Decision block 323 controls the continued encoder algorithm processing. If the iteration counter j is less than n-k+1, then the encoding convolution computations continue with function block 320. If j equals n-k+1, the encoding computations are complete. The last k codeword symbols are in the S register 206 with $C_{k-1}$ in location $s_0$ and $C_0$ in location $s_{k-1}$. All other codeword symbols have appeared at the S OUT line on previous iterations. The remaining k codeword symbols appear on S OUT by shifting the S register 206 in accordance with function block 324.

Referring now to FIG. 7, shown therein is a block diagram of the timing/control unit 160 which includes a counter 423 which is responsive to a clock signal CLK and an encode/decode signal. The encode/decode signal is an externally provided control signal which indicates whether encoding or decoding is to be performed. The counter 423 provides the count i which increments with each clock cycle. The upper limit of the counter 423 is set in conjunction with the encode/decode signal. The count i is provided to the arithmetic unit 120 of FIG. 1 as detailed in FIG. 5, and is further provided to a processor and iteration control logic circuit 425 of FIG. 7.

From the prior discussion, it should be appreciated that the timing of the encoder/decoder processing is based on the count i and the iteration count j. For decoding, there are n iterations of j; and each iteration of j includes n counts of i. Thus, decoding requires $n^2$ clock cycles. For encoding there are (n–k) iterations of j; and each iteration of j includes k counts of i. Thus, encoding requires k(n–k) clock cycles.

The processor/iteration control logic 425 provides the control and sequencing of the arithmetic unit 120 of FIG. 5. The input I1 accepts the count i provided by the counter 423.

The input I2 receives the result of the decision made pursuant to the decision block 309. That decision is provided by circuitry that includes a j-count register 403 that receives the iteration value j from the output Q7 of the control logic 425. An e-count register 405 is loaded with the number of erasures at initialization. An adder 407 is responsive to the j-count and e-count registers 403, 405 and provides an output equal to (j–e–1). A comparator 415 compares the output of the adder 407 with the shifted output lines of the L-count register 411 with the least significant bit set to zero. Such shift is equivalent to multiplying L by a factor of 2, and provides the value of 2L. The output of the comparator 415 is provided as an input to an AND gate 421, which receives another input from another comparator 426 which provides an output indicating whether or not the discrepancy value $d_j$ is equal to zero. The discrepancy value $d_j$ is provided by the register 226 in FIG. 5.

The input I3 receives the result of determining whether the number of erasures e found prior to decoding is greater than 2t. Such determination is made by a comparator 409 which compares the contents of the e-count register 405 with 2t. If the number of erasures is greater that 2t, decoding is controlled to stop since an excessive number of erasures occurred.

The input I4 receives the encode/decode signal for controlling whether encode or decode processing is to be performed. This input affects all outputs of the timing control unit 160.

The output Q1 controls the input loading and clocking of the vector registers 206, 214, 236 in the arithmetic unit 120 detailed in FIG. 5. The output Q2 controls the output clock of such registers. These two outputs are carried out in conjunction with each other using the count i provided at the input I1 and are dependent upon the particular processing being performed.

The output Q3 provides the signals for switching the multiplexers of the arithmetic unit 120 for the encode and decode operations. The different connections provided by the multiplexers are controlled pursuant to the inputs I1 through I4.

The output Q4 controls the accumulator functions of the registers 224, 226, 244, 248 in the arithmetic unit 120, and further controls the Galois shift logic circuit 250. The controls depend on the interation count j and its inner count i.

The output Q5 handles the initialization of the vector registers 206, 214, 236 of the arithmetic unit 120 of FIG. 5. The initialization processing is set forth in the function block 301 of FIG. 4 and in the function block 319 of FIG. 6.

The output Q6 provides the clocking for reconstructing the received data vector pursuant to the function block 318 in FIG. 4. The values of K calculated for such reconstruction are provided to the divider 232 of the arithmetic unit 120 of FIG. 5.

The output Q7 provides the iteration counts j on the basis of the loop count i provided at the input I1 and the encode/decode control provided at the input I4.

A summing circuit 413 provides some of the processing pursuant to the function block 310 of FIG. 4 by computing (j–L–e) from the values provided by the adder 407 and the L-count register 411. The log circuit 419 provides the binary vector representation of the exponent of the discrepancy value $d_j$ which is provided to the position 1 input of the multiplexer 230 of the arithmetic unit 120 of FIG. 5.

The foregoing has been a disclosure of an encoder/decoder which provides advantages including the following. The encoder/decoder of the invention provides for substantial reduction in decoding time and overall complexity. Further, the decoder utilizes three parallel processors for achieving optimum parallel processing. In addition, the decoder implements strictly time domain processing to eliminate delays caused by transforming back and forth between the time and frequency domains. Also, the encoder/decoder is capable of operating with a wide class of codes, and allows for the use of more complex codes while achieving a high rate of data throughput.

In addition to the features which optimize decoding time, the same described architecture provides inherent flexibility in order to accommodate algebraic coding options. Having this flexibility within this single architecture is a particular advantage over other prior art encoders and decoders. In particular, the architecture is capable of encoding/decoding the BCH class of codes and especially all other code classes which can be decoded by BCH decoders. Hence, the disclosed architecture is applicable to the Alternant code family, which includes BCH, Goppa, Strivastava, and Reed-Solomon codes, while maintaining a high rate of data throughput. Furthermore, this same architecture is capable of encoding/decoding various combinations of information symbols and codeword lengths. This capability with different code sizes is achieved using a minimal set of distinct fundamental arithmetic elements. Finally, in addition, this single architecture is compatible with codes over a variety of Galois Field $GF(p^m)$ structures.

Although the foregoing has been a description and illustration of specific embodiments of the invention, various modifications and changes thereto can be made by persons skilled in the art without departing from the scope and spirit of the invention as defined by the following claims.

What is claimed is:

1. A decoder apparatus responsive to a received data vector having a plurality of symbols and being based on a predetermined encoding polynomial, comprising:

first processing means responsive to the received data vector
for iteratively calculating intermediate components of a time domain syndrome vector, and for calculating locations and counts of erasures in the received data vector,
and further for iteratively extending the time domain syndrome vector in response to a discrepancy constant to provide an extended syndrome vector, wherein the final extended syndrome vector represents an error vector;

second processing means responsive to the extended time domain syndrome vector components, to intermediate components of an errata vector, and to the erasure locations and counts for iteratively calculating components of the errata vector and for storing said iteratively calculated components of the errata vector, and further for calculating a discrepancy constant based on each iteration of said intermediate extended syndrome vector components and said errata vector components; third processing means, responsive to the erasure locations and counts, for iteratively calculating intermediate components of an erasure vector and for storing said intermediate erasure vector components, and responsive to the erasure vector components and the erasure locations and counts, for iteratively calculating said intermediate errata vector components, and responsive to the received data vector and the error vector for providing a corrected output signal; and control means for controlling the operations of said first, second, and third processing means.

2. The decoder apparatus of claim 1 wherein said first processing means comprises:

means for recirculating and storing intermediate syndrome and extended syndrome components; and means for multiplying intermediate syndrome and extended syndrome vector components by predetermined factors to provide intermediate syndrome vector components for the next iteration.

3. The decoder apparatus of claim 1 wherein said second processing means comprises:

means for multiplying corresponding intermediate syndrome vector components and intermediate erasure vector components to provide component products; and means for accumulating said component products to provide said discrepancy constant.

4. The decoder apparatus of claim 1 wherein said third processing means comprises:

means for storing predetermined vector components, said predetermined vector components being a replica of intermediately calculated components of said erasure vector for the iterative calculation of said erasure vector;

means for respectively calculating adjustment factors for said predetermined vector components as a function of the location of the erasures of the received codeword;

means for multiplying said predetermined vector components by corresponding adjustment factors and for adding the resulting products to corresponding intermediate erasure vector components to provide erasure vector components for the next iteration; and means for dividing and storing intermediate errata vector components by said discrepancy constant for providing errata update vector components for the next iteration; and means for dividing and storing intermediate update vector components by predetermined factors of $GF(p^m)$ for providing errata update vector components for the next iteration.

* * * * *